United States Patent
Acharya et al.

(10) Patent No.: US 9,541,604 B2
(45) Date of Patent: Jan. 10, 2017

(54) LOOP POWERED ISOLATED CONTACT INPUT CIRCUIT AND METHOD FOR OPERATING THE SAME

(71) Applicant: GE Intelligent Platforms, Inc., Charlottesville, VA (US)

(72) Inventors: Parag Vishwanath Acharya, Hyderabad (IN); Ravindra Mahavir Desai, Hyderabad (IN)

(73) Assignee: GE INTELLIGENT PLATFORMS, INC., Charlottesville, VA (US)

( * ) Notice: Subject to any disclaimer, the term of this patent is extended or adjusted under 35 U.S.C. 154(b) by 351 days.

(21) Appl. No.: 13/872,492

(22) Filed: Apr. 29, 2013

(65) Prior Publication Data

US 2014/0320138 A1 Oct. 30, 2014

(51) Int. Cl.
| | | |
|---|---|---|
| G01R 31/02 | (2006.01) | |
| G01R 31/327 | (2006.01) | |
| H01H 47/00 | (2006.01) | |
| H02J 13/00 | (2006.01) | |

(52) U.S. Cl.
CPC ........ G01R 31/3277 (2013.01); H01H 47/002 (2013.01); H02J 13/0013 (2013.01); G01R 31/3275 (2013.01)

(58) Field of Classification Search
CPC ... G01R 31/025; G01R 31/08; G01R 31/2805; G01R 31/024; G01R 31/3278; G01R 31/3275; G01R 31/343; G01R 19/155; H01H 47/002; H01H 9/167; H02H 3/04; H02H 3/006
USPC ......... 324/415–423, 522, 537; 340/644, 635, 340/657; 327/101, 102
See application file for complete search history.

(56) References Cited

U.S. PATENT DOCUMENTS

| | | | |
|---|---|---|---|
| 4,255,789 A | 3/1981 | Hartford et al. | |
| 4,470,041 A | 9/1984 | Sutherland et al. | |
| 4,532,466 A | 7/1985 | Polinski, Jr. | |
| 4,574,355 A | 3/1986 | Beatty et al. | |
| 4,672,529 A | 6/1987 | Kupersmit | |
| 5,481,194 A | 1/1996 | Schantz et al. | |
| 5,506,573 A * | 4/1996 | Ewing et al. | 340/644 |

(Continued)

FOREIGN PATENT DOCUMENTS

| | | |
|---|---|---|
| CN | 2031952 U | 2/1989 |
| CN | 1848577 A | 10/2006 |

(Continued)

OTHER PUBLICATIONS

"AD7740-3 V/5 V Low Power, Synchronous Voltage-to-Frequency Converter", Feb. 1, 2001, pp. 1-11, XP055134658.
PCT Search Report and Written Opinion issued in connection with corresponding Application No. PCT/US2014/035816 on Aug. 25, 2014.

(Continued)

*Primary Examiner* — Son Le
*Assistant Examiner* — Thang Le
(74) *Attorney, Agent, or Firm* — GE Global Patent Operation; Scott R. Stanley

(57) ABSTRACT

A voltage is sensed at a switching device and the voltage is associated with a status of a switching device. The sensed voltage is converted to a useable voltage regardless of the value and type of the sensed voltage. At a single self-contained integrated circuit that is powered by the sensed voltage, the useable voltage is converted into a digital representation. The digital representation is configured to be usable by a processing device to determine the value of the voltage at the switching device.

18 Claims, 2 Drawing Sheets

(56) References Cited

U.S. PATENT DOCUMENTS

| | | | |
|---|---|---|---|
| 5,598,070 A | 1/1997 | Coleman | |
| 5,621,250 A | 4/1997 | Kim | |
| 5,650,703 A | 7/1997 | Yardley et al. | |
| 5,672,919 A | 9/1997 | Johnson et al. | |
| 5,729,167 A | 3/1998 | Kujawa et al. | |
| 5,764,174 A | 6/1998 | Dempsey et al. | |
| 5,764,598 A | 6/1998 | Okayasu | |
| 5,777,460 A | 7/1998 | Calligaro et al. | |
| 5,789,960 A | 8/1998 | Bower | |
| 5,861,767 A | 1/1999 | Patel et al. | |
| 5,929,663 A | 7/1999 | Dougherty | |
| 5,952,849 A | 9/1999 | Haigh | |
| 6,008,618 A | 12/1999 | Bose et al. | |
| 6,087,882 A | 7/2000 | Chen et al. | |
| 6,107,948 A | 8/2000 | Scott et al. | |
| 6,115,265 A | 9/2000 | Barlage | |
| 6,124,756 A | 9/2000 | Yaklin et al. | |
| 6,135,085 A | 10/2000 | Toyohara et al. | |
| 6,147,542 A | 11/2000 | Yaklin | |
| 6,157,165 A * | 12/2000 | Kinoshita et al. | 320/116 |
| 6,242,821 B1 | 6/2001 | Macks | |
| 6,291,907 B1 | 9/2001 | Haigh et al. | |
| 6,317,056 B1 | 11/2001 | Klumpp et al. | |
| 6,347,028 B1 | 2/2002 | Hausman, Jr. et al. | |
| 6,400,163 B1 * | 6/2002 | Melcher | G01R 31/3277 324/126 |
| 6,430,229 B1 | 8/2002 | Scott et al. | |
| 6,584,197 B1 | 6/2003 | Boudreaux, Jr. et al. | |
| 6,600,242 B1 * | 7/2003 | Dennison | H01H 1/605 200/1 R |
| 6,611,553 B1 | 8/2003 | Scott et al. | |
| 6,611,724 B1 | 8/2003 | Buda et al. | |
| 6,800,965 B1 | 10/2004 | Turner et al. | |
| 7,019,532 B2 | 3/2006 | Gloeckner et al. | |
| 7,023,187 B2 | 4/2006 | Shearon et al. | |
| 7,119,799 B2 * | 10/2006 | Kaski | H03K 17/9502 200/600 |
| 7,248,097 B2 | 7/2007 | Montgomery | |
| 7,447,492 B2 | 11/2008 | Dupuis | |
| 7,539,533 B2 | 5/2009 | Tran | |
| 7,558,622 B2 | 7/2009 | Tran | |
| 7,626,373 B2 | 12/2009 | Mayell | |
| 7,652,602 B2 | 1/2010 | Miettinen | |
| 7,688,562 B2 * | 3/2010 | Bowman | H02H 1/0007 361/93.6 |
| 7,894,561 B1 | 2/2011 | Buchanan | |
| 8,035,528 B2 | 10/2011 | Acharya et al. | |
| 8,076,796 B1 | 12/2011 | Robinson et al. | |
| 8,169,108 B2 | 5/2012 | Dupuis et al. | |
| 8,299,740 B2 * | 10/2012 | Fukao | E05F 15/695 318/286 |
| 8,704,446 B2 | 4/2014 | Gibbs | |
| 8,756,023 B2 | 6/2014 | Alley | |
| 8,768,635 B2 | 7/2014 | Alley et al. | |
| 9,057,743 B2 | 6/2015 | Alley | |
| 2001/0026159 A1 * | 10/2001 | Price | H02J 13/0055 324/509 |
| 2002/0140434 A1 | 10/2002 | Kraus et al. | |
| 2003/0038017 A1 | 2/2003 | Boyer et al. | |
| 2003/0042909 A1 | 3/2003 | Yamamoto et al. | |
| 2003/0123212 A1 | 7/2003 | Dunk et al. | |
| 2003/0229403 A1 * | 12/2003 | Nakazawa | H01H 9/167 700/13 |
| 2004/0242976 A1 | 12/2004 | Abreu | |
| 2005/0057259 A1 * | 3/2005 | Hornsby | G01R 31/086 324/512 |
| 2005/0156583 A1 | 7/2005 | Nachamiev et al. | |
| 2006/0158171 A1 | 7/2006 | Downey et al. | |
| 2006/0195804 A1 | 8/2006 | Rogers et al. | |
| 2007/0040638 A1 | 2/2007 | Bryan et al. | |
| 2008/0001735 A1 | 1/2008 | Tran | |
| 2008/0004904 A1 | 1/2008 | Tran | |
| 2008/0074909 A1 | 3/2008 | Mehta | |
| 2008/0084323 A1 | 4/2008 | Stad et al. | |
| 2008/0221825 A1 | 9/2008 | Nyffenegger et al. | |
| 2008/0269970 A1 | 10/2008 | Yamada | |
| 2009/0085659 A1 | 4/2009 | Sorace et al. | |
| 2009/0105605 A1 | 4/2009 | Abreu | |
| 2009/0195256 A1 | 8/2009 | Meagher et al. | |
| 2010/0013305 A1 | 1/2010 | Heineman | |
| 2010/0019913 A1 | 1/2010 | Rodseth et al. | |
| 2010/0023284 A1 | 1/2010 | Rodseth et al. | |
| 2010/0232578 A1 | 9/2010 | Zojer et al. | |
| 2010/0283323 A1 | 11/2010 | Single | |
| 2010/0283512 A1 | 11/2010 | Acharya et al. | |
| 2010/0317420 A1 | 12/2010 | Hoffberg | |
| 2012/0044015 A1 | 2/2012 | Magu | |
| 2012/0075895 A1 | 3/2012 | Kletti et al. | |
| 2012/0229946 A1 | 9/2012 | Shirakawa et al. | |
| 2012/0235825 A1 | 9/2012 | Myers et al. | |
| 2012/0299598 A1 | 11/2012 | Alley et al. | |
| 2012/0303297 A1 | 11/2012 | Alley et al. | |
| 2013/0027831 A1 | 1/2013 | Penning | |
| 2013/0099795 A1 * | 4/2013 | Kamata et al. | 324/434 |
| 2013/0278438 A1 | 10/2013 | Mueck | |
| 2013/0279611 A1 | 10/2013 | Mueck | |
| 2014/0312909 A1 | 10/2014 | Alley | |
| 2014/0312923 A1 | 10/2014 | Alley | |
| 2014/0320195 A1 * | 10/2014 | Desai | H01H 47/002 327/382 |

FOREIGN PATENT DOCUMENTS

| | | | |
|---|---|---|---|
| CN | 101345037 A | 1/2009 | |
| CN | 101441230 A | 5/2009 | |
| EP | 0546855 A1 | 6/1993 | |
| EP | 0573771 B1 | 10/1997 | |
| EP | 1940026 A3 | 1/2013 | |
| EP | 2665183 A3 | 10/2014 | |
| JP | H0564783 U | 8/1993 | |
| JP | H0720185 A | 1/1995 | |
| JP | H09129075 A | 5/1997 | |
| JP | 2002122626 A | 4/2002 | |
| JP | 2003066090 A | 3/2003 | |
| JP | 2010019603 A | 1/2010 | |
| JP | 2011158020 A | 8/2011 | |
| WO | 9958988 A2 | 11/1999 | |
| WO | 0239642 A2 | 5/2002 | |
| WO | 2005015163 A2 | 2/2005 | |
| WO | 2006029297 A2 | 3/2006 | |
| WO | 2009015665 A1 | 2/2009 | |
| WO | 2015191101 A1 | 12/2015 | |
| WO | 2015191121 A1 | 12/2015 | |

OTHER PUBLICATIONS

Abb, "S800 I/O Modules Pulse, Frequency and NAMUR inputs", Data Sheet, pp. 1-3.

Dubrova, "International Master Program in System-on-Chip Design, Hardware Redundancy", Design of Fault Tolerant Systems—Elena Dubrova, ESDlab, pp. 1-49.

Beckwith Electric Co.Inc.,"Universal Contact Input Adapter M-3908", http://web.archive.org/web/20101226101726/http://beckwithelectric.com/docs/specs/M-3908-SP-06MC1, 2005.

Kastenstmidt et al., "On the Optimal Design of Triple Modular Redundancy Logic for SRAM-Based FPGAs", Proceedings on Design, Automation and Test in Europe, vol. No. 2, pp. 1290-1295, Mar. 7-11, 2005.

Zhang et al., "Current Sharing in Digitally Controlled Masterless Multi-phase DC-DC Converters", Power Electronics Specialists Conference, Jun. 16, 2005.

Sun, "Dynamic Performance Analyses of Current Sharing Control for DC/DC Converters", PhD Thesis, Virginia Polytechnic Institute and State University, 2007.

Sackett, "Constant-Power Source", Maxim Integrated, pp. 1-4, Oct. 27, 2009.

RTP Corp "4-Channel SIL-3 Analog Output Card", http://www.rtpcorp.com/documents/4ChAnalogOutput_009.pdf, 2011.

Nationai Instruments, "Redundant System Reference Design for LabVIEW Real Time, LabVIEW FPGA, and CompactRIO", http://www.ni.com/white-paper/6900/en/, Aug. 9, 2013.

(56) References Cited

OTHER PUBLICATIONS

"DeltaV CHARMs Commissioning", Emerson Process Management, pp. 1-27, Jan. 2014.
PCT Search Report and Written Opinion issued in connection with corresponding PCT Application No. PCT/US2014/035688 on Aug. 19, 2014.
PCT Search Report and Written Opinion issued in connection with corresponding PCT Application No. PCT/US2015/016798 on May 27, 2015.
PCT Search Report and Written Opinion issued in connection with corresponding PCT Application No. PCT/US2014/71259 on Jun. 24, 2015.
Unofficial English Translation of Chinese Office Action issued in connection with related CN Application No. 201210165782.5 on Oct. 9, 2015.
Final Rejection dated Oct. 23, 2015 issued in connection to related U.S. Appl. No. 13/864,333.
Non-Final Rejection towards related U.S. Appl. No. 13/116,869 dated Sep. 5, 2013.
Non-Final Rejection towards related U.S. Appl. No. 13/180,103 dated Sep. 24, 2013.
Unofficial English translation of Office Action issued in connection with corresponding JP Application No. 2012-153241 on May 17, 2016.
Unofficial English translation of Office Action issued in connection with related CN Application No. 201210165782.5 on Jun. 6, 2016.
Non-Final Rejection towards related U.S. Appl. No. 13/864,539 dated Jun. 9, 2016.
Non-Final Rejection towards related U.S. Appl. No. 13/864,333 dated Jul. 11, 2016.
GE Related Case Form.

\* cited by examiner

LOOP POWERED ISOLATED CONTACT INPUT CIRCUIT AND METHOD FOR OPERATING THE SAME

CROSS REFERENCE TO RELATED APPLICATION

Utility application Ser. No. 13/782,496 entitled "Universal Contact Input Apparatus and Method for Operating the Same" naming as inventors Parag Acharya and Ravindra Desai, is being filed on the same date as the present application, the content of which is incorporated herein by reference in its entirety.

BACKGROUND OF THE INVENTION

Field of the Invention

The subject matter disclosed herein relates to sensing information associated with switching devices and, more specifically, to sensing this information according to a wide range of operating conditions.

Brief Description of the Related Art

Different types of switching devices (e.g., electrical contacts, switches, and so forth) are used in various environments. For example, a power generation plant uses a large number of electrical contacts (e.g., switches and relays). The electrical contacts in a power generation plant can be used to control a wide variety of equipment such as motors, pumps, solenoids and lights. A control system needs to monitor the electrical contacts within the power plant to determine their status in order to ensure that certain functions associated with the process are being performed. In particular, the control system determines whether the electrical contacts are on or off, or whether there is a fault near the contacts such as open field wires or shorted field wires or grounded field wires that affect the ability of the contacts to perform their intended function.

One approach that a control system uses to monitor the status of the electrical contacts is to send an electrical voltage (e.g., a direct current voltage (DC) or an alternating current (AC) voltage) to the contacts in the field and determine whether this voltage can be detected. The voltage, which is provided to the electrical contacts for detection, is known as a wetting voltage. If the wetting voltage levels are high, galvanic isolation in the circuits is used as a safety measure while detecting the existence of voltage. Detecting the voltage is an indication that the electrical contact is on or off. A wetting current is associated with the wetting voltage.

Various problems have existed with previous devices. For example, the contacts need to be isolated from the control system due to the application of high wetting voltage, or damage to the control system may occur. Also, the control system may need to handle a wide variety of different voltages, but previous devices only handle voltages within a narrow range. Previous devices have also been inflexible in the sense that they cannot be easily changed or modified over time to account for changes in the operating environment. All of these problems have resulted in general dissatisfaction with previous approaches.

BRIEF DESCRIPTION OF THE INVENTION

The approaches described herein provide contact status sensing circuits that are power efficient and which can operate across a wide range of wetting voltages (e.g., from approximately 15 Vdc to approximately 250 Vdc to mention one example). In other aspects, the contact input circuits described herein can also process both direct current (DC) voltages and alternating current (AC) voltages.

In these regards, a contact (or other switching device) is wetted with either a DC or an AC voltage source. When the contact is closed, the wetting voltage appears across the sensing circuit. When the contact is open, there is no voltage across the load. To take one example, the DC wetting voltage can be in the range of approximately 15 Vdc to as high as approximately 250 Vdc. The AC wetting voltage can be approximately 110V/60 Hz or approximately 230V/50 Hz to mention two examples.

The present approaches provide a universal approach that can handle the entire wetting voltage range and/or multiple voltage types. In order to provide diagnostics for wetting voltage health and provide field line status such as open, shorted, or grounded field cable or wire (using resistors in series and parallel with the contact) the present approaches measure voltage with an almost constant current that is drawn from the contact (the wetting current) and provide a galvanic isolation from main control system.

The approaches described herein provide smart loop powered, point isolated universal sensing and measurement with high resolution and accuracy, and low power dissipation. A high resolution circuit is provided and this allows the measuring of small variations or changes in input voltage and thereby enables the detection of various conditions of field cables (or other wires or switching devices) at different input voltage ranges. Additionally, the present approaches can process non-sinusoidal AC wetting waveforms. These approaches allow a control system to log sequence of events (SOEs) with improved accuracy (e.g., an accuracy of much greater than 1 mS).

Besides being able to handle a large wetting voltage range and detect the contact status (e.g., open or closed), the present approaches also monitor the line voltage. This monitoring occurs in real time and is advantageous because it helps as one of the inputs in detecting field wire status and the health of wetting voltage. This also helps as one of the inputs in identifying the ground fault of filed wires. Based on the monitoring, control system can raise diagnostic alarms for the operator information.

In many of these embodiments, a voltage is sensed at a switching device and the voltage is associated with a status of a switching device. The sensed voltage is converted to a useable voltage regardless of the value and type of the sensed voltage. At a single self-contained integrated circuit that is powered by the sensed voltage, the usable voltage is converted into a digital representation. The digital representation is configured to be usable by a processing device to determine the value of the voltage at the switching device.

In other aspects, the digital representation is received at the processing device and the voltage at the switching device is determined. In some examples, the sensed voltage type may be a direct current (DC) voltage or an alternating current (AC) voltage. In other examples, the status may an open status or a closed status of the switching device.

In other aspects, the self-contained integrated circuit is galvanically isolated from a control system. In some other examples, clocking signal is received from a control system. In other examples, the processing device is at a control system.

In others of these embodiments, an apparatus configured to determine information concerning a switching device, the apparatus includes a sensing circuit, a voltage attenuator circuit, and a single self-contained integrated circuit.

The sensing circuit is configured to sense a voltage at a switching device and the voltage is associated with a status of a switching device. The voltage attenuator circuit is coupled to the sensing circuit. The voltage attenuator circuit is configured to convert the sensed voltage to a useable voltage proportional to the value and type of the sensed voltage.

The single self-contained integrated circuit is coupled to the voltage attenuator circuit. The single self-contained integrated circuit is powered by the constant voltage source generated from sensed voltage and is configured to convert the usable voltage into a digital representation. The digital representation is configured to be usable by a processing device to determine the value of the voltage at the switching device.

In others of these embodiments, an apparatus configured to determine information concerning a switching device includes a sensing circuit, a voltage attenuator circuit, and a conversion block. The sensing circuit is configured to sense a voltage at a switching device and the voltage is associated with a status of a switching device.

The voltage attenuator circuit is coupled to the sensing circuit and configured to convert the sensed voltage to a useable voltage regardless of the value and type of the sensed voltage. The conversion block is coupled to the voltage attenuator circuit and is powered by the sensed voltage. The conversion block is configured to convert the usable voltage into a digital representation and the digital representation is configured to be usable by a processing device to determine the value of the voltage at the switching device. The voltage sensing circuit includes a bridge rectifier, a constant voltage block, and a reference generator and the apparatus further includes a first isolation circuit and a second isolation circuit. The first isolation circuit and the second isolation circuit are coupled to the conversion block. The first isolation circuit and the second isolation circuit isolate the version circuit from an external processing device.

In some aspects, the bridge rectifier, the voltage attenuator circuit, and the constant voltage block are disposed on a single, self-contained integrated circuit. In other aspects, the reference generator, the first isolation circuit, and the second isolation circuit and the conversion block are disposed on a single, self-contained integrated circuit. In yet other aspects, the bridge rectifier, the voltage attenuator circuit, the constant voltage block, the reference generator, the first isolation circuit, the second isolation circuit, and the conversion block are disposed on a single, self-contained integrated circuit. It will be appreciated that any combination of elements can be disposed on a single, self-contained integrated circuit.

BRIEF DESCRIPTION OF THE DRAWINGS

For a more complete understanding of the disclosure, reference should be made to the following detailed description and accompanying drawings wherein.

Figure 1:
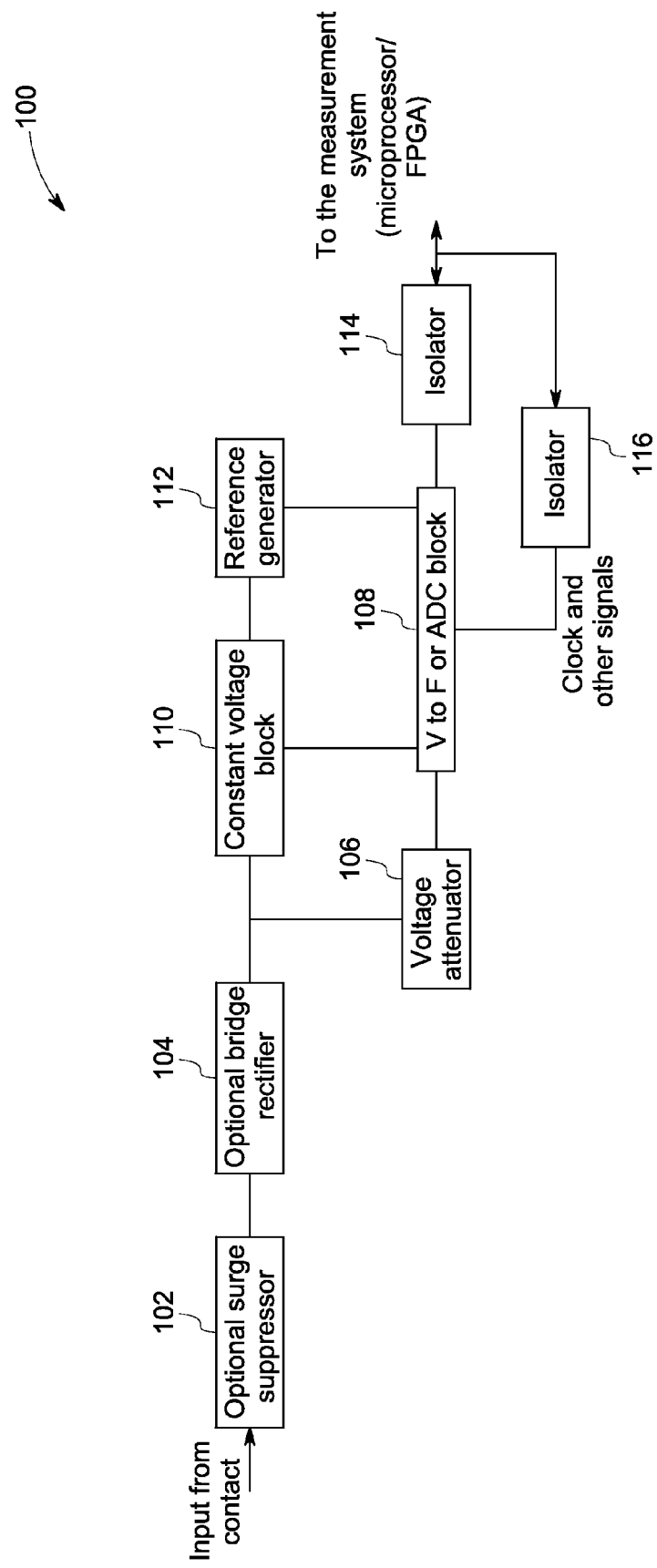
FIG. 1 comprises a block diagram of a contact input circuit according to various embodiments of the present invention.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION OF THE INVENTION

The approaches described herein provide a contact input circuit that is used to detect, for example, the status of a remotely located relay contact (or other switching device). In some examples, the wetting voltage applied to such a relay contact can be in the range of approximately 15 Vdc to approximately 250 Vdc; approximately 110 Vac/60 Hz, or approximately 230V/50 Hz to mention a few examples. This range matches the choice of a user and accommodates a wetting voltage of approximately 24 Vdc; approximately 48 Vdc; approximately 125 Vdc; approximately 250 Vdc; approximately 110 Vac/60 Hz; or approximately 230 Vac/50 Hz (to mention a few examples).

The present approaches provide much better resolution and accuracy than previous approaches. In these respects, the approaches described herein can detect much smaller steps in the input voltage and various conditions in line monitoring at different wetting voltage levels. In other aspects, the circuits described herein also operate with and detect different non-sinusoidal AC waveforms and because they provide very high resolution, can interpret and convey the correct information to a control system (e.g., that uses a microprocessor). Because high resolution and accuracy of measurements is provided by the present approaches, the detection of much smaller steps in the input voltage and, consequently, many different conditions in line monitoring at different wetting voltage levels is achieved.

The circuit topologies described herein are also capable of measuring the wetting voltage either in steps or continuously. In some examples, surge suppressors are used to protect the circuit from any voltage pile up after the contact switches off the inductive load. A bridge rectifier (or other similar arrangement) can also be utilized to make the circuit polarity insensitive and add the capability to provide measurements for AC contact wetting voltages.

In some aspects, a constant voltage block ensures the constant voltage for the further blocks irrespective of the amplitude of the input voltage. This block can, for instance, be a series pass transistor or MOSFET circuit or even can be a simple resistor-zener diode circuit. A voltage attenuator circuit provides the sensing signal to analog-to-digital converter (ADC)/voltage controlled oscillator (VCO) block. Voltage-to-frequency converters (e.g., a VCO) or an ADC converts the input analog signal into proportional digital signal with high accuracy and resolution. Various types of isolators can be utilized take the digital conversion to a control system or processor section or Field Programmable gate Array (FPGA) smart block. Another isolator block carries the required digital signals like clock from the smart block. In one embodiment, the clock circuit can be present in the same block. In this case, there is no need to have separate isolator circuit.

The present approaches provide the ability to sense a very wide (e.g., 30:1 or more) range of isolated input voltages with adequate resolution per unit time (e.g., an output frequency of minimum 100 s of KHz and sensing time of less than 1 ms).

In other aspects, the circuits provided herein are powered entirely from the input signal (i.e., they are "loop powered."). This avoids the need for isolated external power as part of the voltage sensing function thereby reducing the component cost and eliminating a substantial source of circuit failure. The circuits described herein operate over a range of input voltages while maintaining a small quantity but near-constant load current.

The operating frequency of the circuits of the present approaches makes it possible to resolve a contact change within, for example, 1 ms satisfying the time resolution requirement for sequence of event (SOE) recording. Acquiring each input as a voltage level permits line fault monitoring where voltage levels indicate both contact position and the health of the wiring on that contact. This monitoring is performed, in one aspect, by firmware acting on the input voltage, is configurable, and requires no additional hardware features. In order to detect different voltage levels for line fault monitoring, good output linearity is provided with respect to the variation in the input voltage.

In other advantages, the input connections of the sense circuit are not polarity sensitive. The present approaches can be used for any voltage sensing, contact sensing through wetting voltage, field line monitoring, and can replace costly analog isolators in some cases. A hybrid integrated circuit can include and incorporate the contact input circuits described herein.

Turning now to FIG. 1, a block diagram of a contact input circuit 100 is illustrated in accordance with various approaches. A signal from a contact switch (e.g., a wetting current on a circuit) is sent through an optional surge suppressor unit 102 which is configured to reduce or eliminate power surges on incoming signals from lighting strikes or inductive load switching that may otherwise damage the remainder of the circuit 100. The contact switch (not shown) may be any type of switching device. The input signal may also pass through an optional bridge rectifier 104 configured to allow the contact input circuit 100 to operate with an alternating current (AC) input across the switch contacts or make the circuit polarity independent. Next, the input passes through a voltage attenuator circuit 106 which will lower the input voltage (which, by some approaches, may range from approximately 0 to 350V, either direct current (DC) or AC) to a usable level for the remainder of the contact input circuit 100 (for example, approximately 5V maximum by one approach). By some approaches, the contact input circuit 100 is capable of working with input voltage between approximately 12V and approximately 350V, including approximately 12V, 15V, 24V, 48V, 125V, 240V, as well as AC voltages of approximately 110V and 220V. Other voltages may also be used.

The attenuated input signal passes to a conversion block 108. By one approach, the conversion block 108 is a voltage controlled oscillator (VCO). This type of conversion block 108 will convert the incoming voltage signal received from the attenuator circuit 106 to an oscillating signal whose frequency is dependant upon the received voltage. In another aspect, the conversion block 108 is an analog to digital converter (ADC) that will convert the incoming attenuated voltage level to a digital output representative of the voltage level. The output of the conversion block 108 is then fed to a first isolation circuit 114 that is configured to allow communications to pass through an isolation barrier (e.g., a galvanic isolation barrier) between the conversion block 108 and a control system. A second isolation circuit 116 may be configured to allow other signals to cross the isolation barrier such as, for example, clocking and other signals from a control system to the conversion block 108. The first isolation circuit 114 and the second isolation circuit 116 communicate with a control system or processor (not shown). The control system may also include any combination of processing devices (e.g., processors) that execute programmed computer software and that are capable of analyzing information received from the contact input circuit 100.

Advantageously, by one approach, the contact input circuit 100 is powered by the loop voltage on the input contacts. To achieve this, the input voltage signal (from the optional bridge rectifier 104) is fed into a constant voltage block 110 in parallel with the voltage attenuator circuit 106. The constant voltage block 110 will serve to create a regulated output that is useable by other options of the contact input circuit 100 to power the circuit 100. For example, the conversion block 108 may be powered by the regulated voltage from the constant voltage block 110. Additionally, a reference voltage generator 112 can be provided that receives voltage from the constant voltage block 110. This reference voltage may be usable by other portions of the circuit 100. For example, the conversion block 108 may utilize the reference voltage from the reference voltage generator 112 during its conversion process. As described elsewhere herein, the conversion block 108 is a single self-contained integrated circuit such as a voltage controlled oscillator (VCO) or an analog to digital converter (ADC). Other examples of single self-contained integrated circuits or possible. In one aspect, these devices comprise a single, physical chip or similar device. In another aspect, the elements 108, 112, 114 and 116 can form single self-contained integrated circuit. In one more aspect the elements 104, 106 and 110 can form a single integrated circuit block in a big package with the voltage clearances that are addressed properly. In one more aspect, all the blocks can be a self-contained big packaged integrated circuit.

So configured, the contact input circuit 100 may be powered from the input voltage without requiring any additional power to be provided to the contact input circuit 100 by a control system or elsewhere. This serves to reduce component count, eliminates a substantial source of circuit failure, and improves compatibility of the circuit 100 with various control systems.

Figure 2:
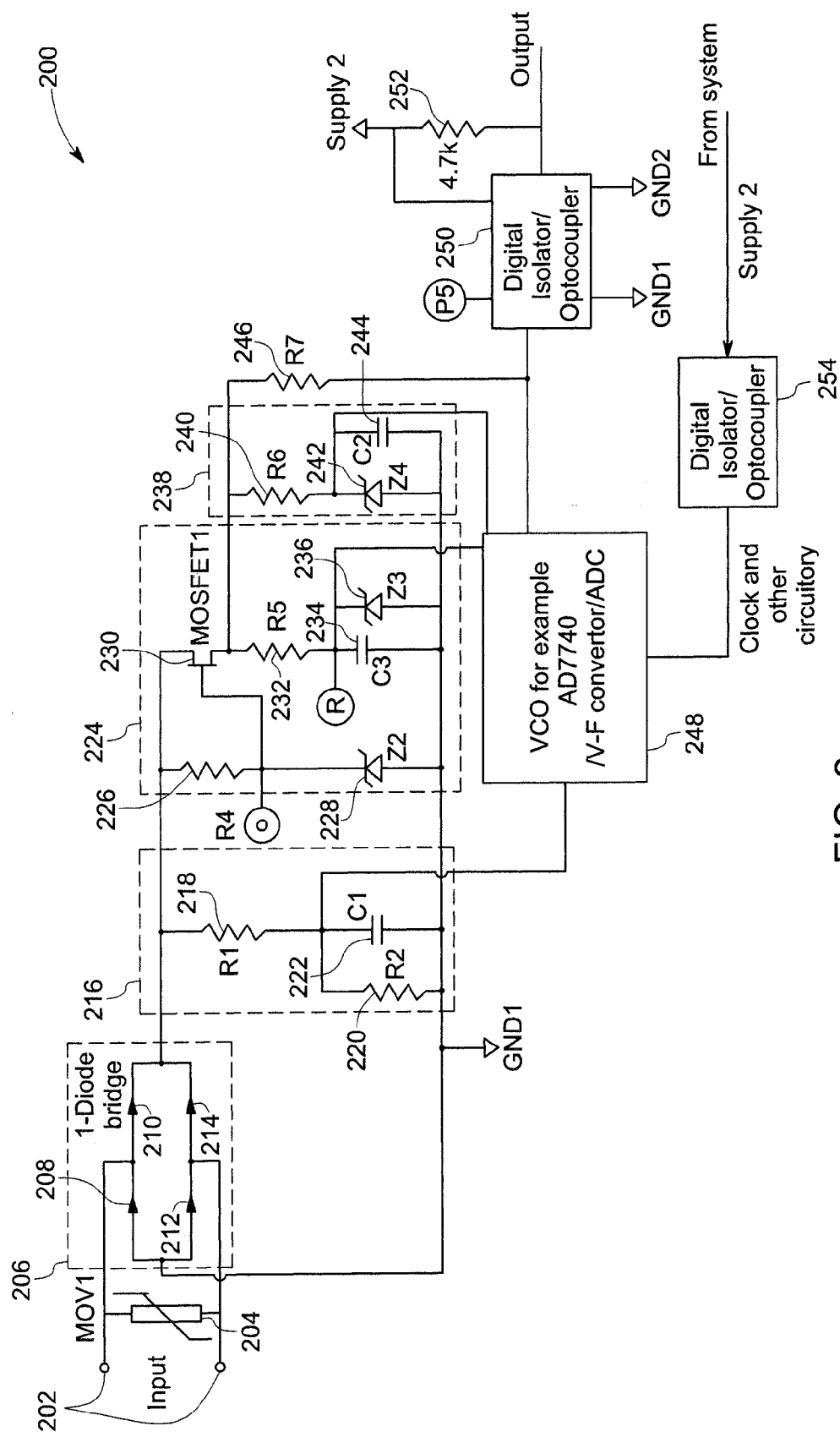
FIG. 2 comprises a circuit diagram of a contact input circuit according to various embodiments of the present invention.

Turning now to FIG. 2, a circuit diagram illustrating the contact input circuit 200 is provided in accordance with one approach. The circuit 200 includes at least two inputs 202 received from one contact and a surge protection module 204 (here, illustrated as a metal oxide varister (MOV), though many types of surge protection may be utilized). The circuit 200 also includes the optional bridge rectifier 206 including diodes 208, 210, 212, and 214 arranged in a standard bridge rectification configuration. The circuit 200 also includes a voltage attenuator circuit 216, here shown as a resistor voltage divider circuit including resistors 218 and 220, whose ratio of values determines the output voltage. An optional low value filtering capacitor 222 may be provided to help filtering the field noise in the voltage from the bridge rectifier 206. The output of the voltage attenuator circuit 216 (being the node between the resistors 218 and 220) is fed into a conversion block 248.

The non-attenuated voltage input is also fed to a constant voltage block 224. By one approach, the constant voltage block 224 includes a transistor 230 (here shown as an N channel MOSFET, though other transistor types may be suitable) with the gate of the transistor 230 receiving the input voltage through a resistor 226 and the gate voltage set by a zener diode 228. By this arrangement, the gate voltage remains clamped to the value of the zener diode 228 once the input voltage exceeds at least the voltage of the zener diode 228, with the value of the zener diode 228 being set to ensure current flows through the transistor 230. The drain of the transistor 230 is coupled to the voltage input, and a source of the transistor 230 is coupled to a resistor 240 which is in series with a zener diode 242. The output of the constant voltage regulator is at the top of the zener diode 242 and can be fed to other portions of the circuit 200, such as the conversion block 248 and the digital isolator 250. A filtering capacitor 242 may be placed between the output and ground to produce a more constant voltage output.

In a similar manner, a reference voltage circuit includes a resistor 232 also coupled to the source of the transistor 230 with a zener diode 236 in series with the resistor 232 and tied to ground. The value of the zener diode 236 establishes the output reference voltage of the reference voltage block. This reference voltage can also be provided to other portions of the circuit 200, such as the conversion block 248.

The conversion block 248 receives the attenuated input voltage. By one approach the conversion block 108 is a voltage controlled oscillator (VCO). The VCO will convert the incoming voltage signal received from the attenuator circuit 106 to an oscillating signal whose frequency is dependant upon the received voltage. The VCO will output the oscillating signal to a digital isolator 250, which, by one approach, is an optocoupler. The output of the conversion block 248 may be coupled to a high voltage through a pull up resistor 246. The digital isolator 250 will communicate a digital representation of the oscillating signal across an isolation barrier to the control system. The output of the digital isolator 250 may be coupled to a pull up resistor 252. The control system may communicate a clock signal or other signals back to the conversion block 248 through an additional isolator 254 to ensure proper communication therebetween. By one approach, the digital isolator 250 and the isolator 254 are the same isolator.

By another approach, the conversion block 248 is an analog to digital converter (ADC) that will convert the incoming attenuated voltage level to a digital output representative of the voltage level. This digital output signal is communicated through the digital isolator 250 to the control system.

So configured, a universal contact input circuit 100, 200 can operate with a wide range of input voltages and input voltage types (e.g., DC and AC, as well as non-sinusoidal AC) and is powered therefrom. The disclosed contact input circuit 100, 200 provides sensing that can accommodate the entire input voltage range and provide measurements of increased resolution and accuracy to a control system. Further, the circuit can be used to capture sequence of events data regarding an input voltage with high time-wise resolution beyond even 1 ms. Further still, the disclosed circuit 100, 200 provides improved temperature sensitivity. The circuits 100, 200 can be used to monitor different conditions on the input contacts (e.g., open or close status, existence of wetting current, to mention a few examples).

In other advantages, the present approaches provide very high resolution (e.g., multiples with respect to previous approaches); provide fast responses and high accuracy; and can be disposed on or in a single application specific integrated circuit (ASIC), microprocessor, microcontroller, or other integrated devices.

It will be appreciated that the various examples described herein use various components (e.g., resistors and capacitors) that have certain values. Some of these values may be shown in the figures. If not shown, these values will be understood or are easily obtainable by those skilled in the art and, consequently, are not mentioned here.

It will be appreciated by those skilled in the art that modifications to the foregoing embodiments may be made in various aspects. Other variations clearly would also work, and are within the scope and spirit of the invention. The present invention is set forth with particularity in the appended claims. It is deemed that the spirit and scope of that invention encompasses such modifications and alterations to the embodiments herein as would be apparent to one of ordinary skill in the art and familiar with the teachings of the present application.

What is claimed is:

1. A method of determining information concerning a switching device, the method comprising:
    sensing a voltage at the switching device using a voltage sensing circuit, the voltage associated with a status of the switching device;
    converting the sensed voltage to a useable voltage regardless of a value and a type of the sensed voltage;
    at a single self-contained integrated circuit that is powered by the sensed voltage:
    converting the useable voltage into a digital representation using the conversion block, the digital representation configured to be usable by a processing device to determine the value of the voltage at the switching device;
    wherein the voltage sensing circuit comprises a bridge rectifier, a constant voltage block, and a reference generator and further comprises a first isolation circuit and a second isolation circuit, the first isolation circuit and the second isolation circuit coupled to the conversion block such that the first isolation circuit and the second isolation circuit isolate the conversion circuit from an external processing device.

2. The method of claim 1 further comprising: receiving the digital representation at the processing device and determining the voltage at the switching device.

3. The method of claim 1 wherein the type of sensed voltage is a type selected from the group consisting of a direct current (DC) voltage and an alternating current (AC) voltage.

4. The method of claim 1 wherein the status comprise an open status or a closed status.

5. The method of claim 1 wherein the single self-contained integrated circuit is galvanically isolated from a control system.

6. The method of claim 1 further comprising receiving a clocking signal from a control system.

7. The method of claim 1 wherein the processing device is at a control system.

8. An apparatus configured to determine information concerning a switching device, the apparatus comprising:
    a voltage sensing circuit, the sensing circuit configured to sense a voltage at the switching device, the voltage associated with a status of the switching device;
    a voltage attenuator circuit, the voltage attenuator circuit coupled to the sensing circuit, the voltage attenuator circuit configured to convert the sensed voltage to a useable voltage regardless of a value and a type of the sensed voltage;
    a single self-contained integrated circuit coupled to the voltage attenuator circuit, the single self-contained integrated circuit being powered by the sensed voltage and configured to convert the useable voltage into a digital representation, the digital representation configured to be usable by a processing device to determine the value of the voltage at the switching device;

wherein the voltage sensing circuit comprises a bridge rectifier, a constant voltage block, and a reference generator and further comprises a first isolation circuit and a second isolation circuit, the first isolation circuit and the second isolation circuit coupled to the conversion block such that the first isolation circuit and the second isolation circuit isolate the conversion circuit from an external processing device.

9. The apparatus of claim 8 further comprising a control system coupled to the single self-contained integrated circuit, the control system configured to receive the digital representation at the processing device and determine the voltage at the switching device.

10. The apparatus of claim 8 wherein the type of sensed voltage is a type selected from the group consisting of a direct current (DC) voltage and an alternating current (AC) voltage.

11. The apparatus of claim 8 wherein the status comprise an open status or a closed status.

12. The apparatus of claim 8 wherein the single self-contained integrated circuit is galvanically isolated from a control system.

13. The apparatus of claim 8 wherein the single self-contained integrated circuit is configured to receive a clocking signal from a control system.

14. The apparatus of claim 8 wherein the processing device is disposed at a control system.

15. An apparatus configured to determine information concerning a switching device, the apparatus comprising:
   a voltage sensing circuit, the voltage sensing circuit configured to sense a voltage at the switching device, the voltage associated with a status of the switching device;
   a voltage attenuator circuit, the voltage attenuator circuit coupled to the voltage sensing circuit, the voltage attenuator circuit configured to convert the sensed voltage to a useable voltage regardless of the value and type of the sensed voltage;
   a conversion block coupled to the voltage attenuator circuit, the conversion block being powered by the sensed voltage and configured to convert the usable voltage into a digital representation, the digital representation configured to be usable by a processing device to determine the value of the voltage at the switching device;
   wherein the voltage sensing circuit comprising a bridge rectifier, a constant voltage block, and a reference generator and further comprising a first isolation circuit and a second isolation circuit, the first isolation circuit and the second isolation circuit coupled to the conversion block such that the first isolation circuit and the second isolation circuit isolate the conversion circuit from an external processing device.

16. The apparatus of claim 15 wherein the bridge rectifier, the voltage attenuator circuit, and the constant voltage block are disposed on a single, self-contained integrated circuit.

17. The apparatus of claim 15 wherein the reference generator, the first isolation circuit, and the second isolation circuit and the conversion block are disposed on a single, self-contained integrated circuit.

18. The apparatus of claim 15 wherein the bridge rectifier, the voltage attenuator circuit, the constant voltage block, the reference generator, the first isolation circuit, the second isolation circuit, and the conversion block are disposed on a single, self-contained integrated circuit.

* * * * *

UNITED STATES PATENT AND TRADEMARK OFFICE
CERTIFICATE OF CORRECTION

| | | |
|---|---|---|
| PATENT NO. | : 9,541,604 B2 | |
| APPLICATION NO. | : 13/872492 | |
| DATED | : January 10, 2017 | |
| INVENTOR(S) | : Acharya et al. | |

It is certified that error appears in the above-identified patent and that said Letters Patent is hereby corrected as shown below:

In the Specification

In Column 1, Line 8, delete "13/782,496" and insert -- 13/872,496 --, therefor.

Signed and Sealed this
Twenty-fifth Day of July, 2017

Joseph Matal
*Performing the Functions and Duties of the*
*Under Secretary of Commerce for Intellectual Property and*
*Director of the United States Patent and Trademark Office*